United States Patent
Bae et al.

(10) Patent No.: US 8,271,255 B2
(45) Date of Patent: Sep. 18, 2012

(54) METHOD OF CALCULATING GATE DELAY BASED ON CROSSTALK EFFECT DUE TO CAPACITIVE COUPLING

(75) Inventors: Tae Il Bae, Daejeon (KR); Young Hwan Kim, Pohang Si (KR); Jinwook Kim, Seongnam Si (KR)

(73) Assignee: Postech Academy-Industry Foundation, Pohang (KR)

(*) Notice: Subject to any disclaimer, the term of this patent is extended or adjusted under 35 U.S.C. 154(b) by 483 days.

(21) Appl. No.: 12/475,544

(22) Filed: May 31, 2009

(65) Prior Publication Data

US 2010/0299114 A1    Nov. 25, 2010

(30) Foreign Application Priority Data

May 25, 2009    (KR) .................. 10-2009-0045655

(51) Int. Cl.
   *G06F 17/50*    (2006.01)
   *G06F 9/455*    (2006.01)
   *G06G 7/62*    (2006.01)
(52) U.S. Cl. ............ 703/14; 703/13; 716/113; 716/115; 716/122
(58) Field of Classification Search .............. 703/13, 703/14; 716/108–113, 115, 122
See application file for complete search history.

(56) References Cited

U.S. PATENT DOCUMENTS

| | | | | |
|---|---|---|---|---|
| 5,568,395 A | * | 10/1996 | Huang | 716/102 |
| 5,675,502 A | * | 10/1997 | Cox | 716/113 |
| 2002/0147553 A1 | * | 10/2002 | Shimazaki et al. | 702/65 |

OTHER PUBLICATIONS

Gross, Paul D. et al., "Determination of Worst-Case Aggressor Alignment for Delay Calculation", 1998, ACM.*
Cho, K. "Delay Calculation Capturing Crosstalk Effects Due to Coupling Capacitors", Apr. 14, 2005, Electronics Letters, vol. 41, No. 8.*
Rajappan, Venkatesan et al., "An Efficient Algorithm for Calculating the Worst-Case Delay Due to Crosstalk", Apr. 19, 2006.*
Solomon Systech Limited, "Application Note Solution of Crosstalk in TFT", Aug. 2008, Solomon Systech Limited.*
Cadence, "Product Documentation: Delay Calculation Algorithm Guide, Product Version 5.0", 2002, Cadence Design Systems, Inc.*
Abbaspour, Soroush et al., "Gate Delay Calculation Considering the Crosstalk Capacitances", Nov. 25, 2003.*
Dartu, Florentin et al. "Calculating Worst-Case Gate Delays Due to Dominant Capacitance Coupling", 1997, ACM.*

(Continued)

*Primary Examiner* — Kandasamy Thangavelu
*Assistant Examiner* — Cedric D Johnson
(74) *Attorney, Agent, or Firm* — Kile Park Goekjian Reed & McManus PLLC

(57) ABSTRACT

Provided is a method of exactly calculating the delay of a gate in a digital integrated circuit (IC) that drives a capacitive load and a noise current source based on a crosstalk effect due to capacitive coupling between adjacent conductive lines, the method calculates the delay of the gate by using an output waveform that sums an output waveform of a linear time-varying output resistance model generated by using a gate output resistance library generated by using input and output voltage values of the digital IC and an output waveform of a modified Thevenin equivalent model of the gate.

4 Claims, 5 Drawing Sheets

OTHER PUBLICATIONS

PRIMA: passive reduced-order interconnect macromodeling algorithm, Altan Odabasioglu et al., IEEE Transactions on Computer-Aided Design of Integrated Circuits and Systems, vol. 17, No. 8, pp. 645-654, Aug. 1998.

Determination of worst-case aggressor alignment for delay calculation, Paul D. Gross et al., Proc. IEEE/ACM International Conference on Computer-Aided Design (ICCAD), 1998, pp. 212-219.

Driver modeling and alignment for worst-case delay noise, David Blaauw et al., IEEE Transactions on Very Large Scale integration (VLSI) Systems, vol. 11, No. 2, pp. 157-166, Apr. 2003.

Tae Il Bae, Jin Wook Kim, Young Hwan Kim, New Gate Models for Gate-Level Delay Calculation under Crosstalk Effects, IEICE Transactions on Fundamentals of Electronics, Communications and Computer Sciences, Dec. 1, 2008, pp. 3488-3496, vol. E91-A No. 12.

* cited by examiner

METHOD OF CALCULATING GATE DELAY BASED ON CROSSTALK EFFECT DUE TO CAPACITIVE COUPLING

CROSS-REFERENCE TO RELATED PATENT APPLICATION

This application claims the benefit of Korean Patent Application No. 10-2009-0045655, filed on May 25, 2009, in the Korean Intellectual Property Office, the disclosure of which is incorporated herein in its entirety by reference.

BACKGROUND OF THE INVENTION

1. Field of the Invention

The present invention relates to a method of calculating the delay of a gate so as to verify the timing of a digital integrated circuit (IC), and more particularly, to a method of exactly calculating the delay of a gate by reflecting a crosstalk effect due to capacitive coupling between adjacent metal conductive lines.

2. Description of the Related Art

The more highly integrated a semiconductor process becomes, the more the height of a metal conductive line included in an integrated circuit (IC), as compared to the width thereof. Capacitive coupling between adjacent conductive lines occupies a portion of 50~70% of the whole capacitance in a conductive line of an IC manufactured during a process to several tens of nano meters due to the above-described physical characteristic. Such a capacitive coupling increases signal crosstalk between adjacent conductive lines.

A signal transition in a net of an IC causes crosstalk noise from adjacent conductive lines through the capacitive coupling. If the crosstalk noise is induced into an adjacent net during the signal transition, distortion of a signal waveform changes the delay of a gate in the adjacent net. Thus, such a change in the delay of a gate due to the crosstalk noise must be considered when a semiconductor is designed.

FIG. 1 is a circuit diagram of gates 100 for driving an interconnect load 102 coupled by a capacitor Cc in a digital IC. Referring to FIG. 1, the gates 100 drive the interconnect load 102 including a capacitive coupling 103.

When the timing of the digital IC is verified, output waveforms of the gates 100 with regard to input voltage waveforms 104 are obtained in a circuit of a single stage, each delay of the gates 100 is calculated, input waveforms of fan-out gates 101 are obtained, and the interconnect delay is calculated. In this regard, each delay of the gates 100 is each delay of the signals between input ends and output ends of the gates 100. The interconnect delay is the delay of a signal between an output end of one of the gates 100 and an input end of the gates 101.

In general, each delay of the gates 100 is calculated on the basis of time that a signal passes over a 50% level of a power voltage. The interconnect delay may be calculated by using a linear system with regard to the output waveforms of the gates 100.

The interconnect load 102 driven by the gates 100 may be expressed in a linear equation. Thus, the admittance relationship with regard to the interconnected load 102 from the output sides of the gates 100 may be approximated in a frequency domain according to equation 1 below by using a conventional model order reduction technique disclosed in cited reference 1 (Altan Odabasioglu, Mustafa Celik, and Lawrence Pileggi, "PRIMA: passive reduced-order interconnect macromodeling algorithm," IEEE Transactions on Computer-Aided Design of Integrated Circuits and Systems, vol. 17, no. 8, pp. 645-654, August 1998), $$\begin{bmatrix} I_1(s) \\ I_2(s) \end{bmatrix} = \begin{bmatrix} \hat{Y}_{11}(s) & \hat{Y}_{12}(s) \\ \hat{Y}_{21}(s) & \hat{Y}_{22}(s) \end{bmatrix} \begin{bmatrix} V_1(s) \\ V_2(s) \end{bmatrix} \quad 1)$$

$$\hat{Y}_{ij}(s) = \sum_{n=1}^{q_{ij}} \frac{\hat{k}_{ijn}}{s - \hat{p}_{ijn}} \quad (q_{ij} << n)$$

Wherein, n denotes the number of poles of a given original linear system, and each admittance term may be approximated as a very small number of poles as compared to the given linear system. The admittance relationship approximated in equation 1 is configured as an equivalent circuit as shown in FIG. 2 and is substituted as the interconnect load 102.

FIG. 2 is a circuit diagram of an equivalent reduced order model of the interconnect load 102 of FIG. 1. Referring to FIG. 2, in cited reference 2 (Paul D. Gross, Ravishankar Arunachalam, Karthik Rajagopal, and Lawrence T. Pileggi, "Determination of worst-case aggressor alignment for delay calculation," in Proc. IEEE/ACM International Conference on Computer-Aided Design (ICCAD), 1998, pp. 212-219), output waveforms of gates 200 and 201 alternate with each other and are iteratively calculated until the output waveforms converge. In more detail, the output waveform of the gate 200, in a state that an output waveform of the previously calculated gate 201 is established, and the output waveform of the gate 201, in a state that an output waveform of the previously calculated gate 200 is established, alternate with each other, and the output waveforms of the gates 200 and 201 are calculated. Such a calculation may be repeatedly performed until the output waveforms converge so that the output waveforms of the gates 200 and 201 can be calculated. The method of calculating the output waveforms of the gates 200 and 201 by repeatedly alternating the output waveforms until the output waveform converge may be equally applied to three or more gates.

The gates 200 and 201 have loads 202 and 203 having the same configuration, respectively. Thus, a method of efficiently calculating output waveforms of a gate and a load circuit enables to calculate an output waveform of each gate.

FIG. 3 is a circuit diagram for explaining calculation of an output waveform of one of the gates 200 and 201 when an output waveform of the other one of the gates 200 and 201 is previously calculated. Referring to FIG. 3, various methods of effectively calculating an output waveform in a circuit having a capacitive load 301 and a noise current source 302 having a current waveform of a gate 300 with regard to an input voltage 303, as a load, have been proposed.

In the circuit of FIG. 3, conventional methods of generating a linear gate model include a transient holding resistance calculation method disclosed in cited reference 3 (David Blaauw, Supamas Sirichotiyakul, and Chanhee Oh, "Driver modeling and alignment for worst-case delay noise," IEEE Transactions on Very Large Scale Integration (VLSI) Systems, vol. 11, no. 2, pp. 157-166, April 2003) and a conventional modified effective capacitance calculation method disclosed in cited reference 2.

The above two methods use a linear gate model 400 including a linear resistor 404 and a voltage source 405 having a saturated ramp waveform, as shown in FIG. 4. The conventional linear gate model 400 includes a capacitive load 401 and a noise current source 402 that are the same as shown in FIG. 3, as loads driven by the gate. Although the linear gate model 400 may be used to obtain an output waveform of the gate, since the linear resistor 404 is a time-invarying resistor, a dynamic change in an output resistance of the gate cannot be exactly reflected.

The conventional modified effective capacitance calculation method uses a cell library with regard to an inclination of an input voltage waveform, 50% delay measured with regard to a single load capacitance, and an inclination of an output waveform. The conventional modified effective capacitance calculation method obtains a value for matching a gate output waveform and a waveform that is discharged by the linear resistor 404 and the load capacitance. In the conventional modified effective capacitance calculation method, the linear gate model 400 does not reflect the dynamic change in the output resistance during the transition of a gate output waveform. Therefore, a noise voltage waveform of a gate output obtained by using the linear gate model 400 may be inexactly calculated and the output waveform of the gate may be also inexactly calculated.

Also, the transient holding resistance calculation method obtains an output waveform through a simulation in the circuit shown in FIG. 3 in order to obtain the output linear resistor 404 of the conventional modified effective capacitance calculation method as a value that exactly reflects non-linearity characteristics of the gate, obtains the output waveform through a simulation with regard to the circuit of FIG. 3 from which the noise current source 302 is removed, and obtains a noise voltage waveform of the gate as a difference between the obtained two output waveforms. Although the transient holding resistance calculation method can obtain an output resistance that more exactly reflects the output characteristics than the conventional modified effective capacitance calculation method, its complicated processing makes it impossible to be applied to timing verification.

SUMMARY OF THE INVENTION

The present invention relates to a method of exactly calculating the delay of a gate in a digital circuit that drives a capacitive load and a noise current source based on a crosstalk effect due to capacitive coupling.

The present invention relates to a linear gate model and a cell library capable of exactly reflecting a dynamic change in a output resistance in a gate.

According to an aspect of the present invention, there is provided a method of calculating the delay of a gate based on a crosstalk effect due to capacitive coupling in a digital integrated circuit (IC), the method including: a operation of generating a gate model of a Thevenin equivalent circuit with regard to a gate circuit in the digital IC under the condition that there is no noise current source, and calculating an output waveform with regard to an input voltage; b operation of generating an output resistance library based on an input voltage and an output voltage of the gate; c operation of generating a linear time-varying output resistance model with regard to the gate by using the input waveform, the output waveform and the output resistance library; d operation of generating a modified Thevenin equivalent gate model of the gate under the condition that there is no noise current source by using the linear time-varying output resistance model, and calculating an output waveform that sums a waveform output by using the modified Thevenin equivalent gate model and an output waveform calculated in response to the noise current source with regard to the linear time-varying output resistance model; and e operation of repeatedly applying the output waveform calculated in operation d to operation c, and, if the output waveform calculated in operation d converges, calculating the delay of the gate by using the converged output waveform.

The operation c may include: firstly generating the linear time-varying output resistance model by using the output waveform calculated in operation a and repeatedly generating the linear time-varying output resistance model by using the output waveform calculated in operation d.

An output resistance of the gate may be measured by using a function of the input voltage and the output voltage of the gate and is divided into a plurality of regions according to the characteristics of the output resistance value.

A representative resistance value for each region and boundaries for dividing the plurality of regions may be used to generate the output resistance library of the gate.

The output resistance library may divide the plurality of regions by using the boundaries of the output resistance values of the gate that dynamically change according to the input voltage and the output voltage of the gate, and each region stores an average output resistance value of the gate.

The output resistance region of the gate of the linear time-varying output resistance model may be divided into more than three regions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 5:
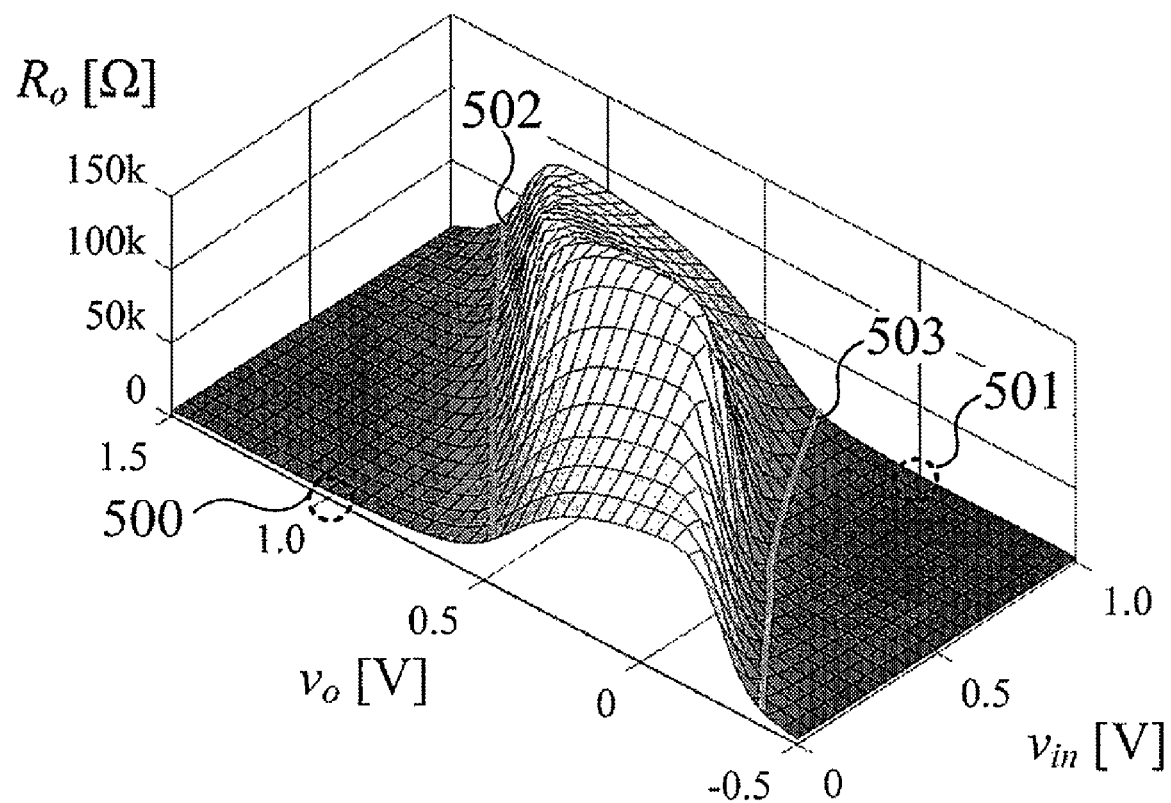
FIG. 5 is a graph of output resistance values measured with regard to an input voltage and an output voltage of an inverter that is a representative complementary metal-oxide semiconductor (CMOS) gate for generating an output resistance library, according to an embodiment of the present invention.

FIG. 5 is a graph of output resistance values $R_o$ measured with regard to an input voltage $v_{in}$ and an output voltage $v_o$ of a gate for generating an output resistance library, according to an embodiment of the present invention. The gate is a complementary metal-oxide semiconductor (CMOS) gate that is an inverter and is assumed as the gate 300 of the circuit shown in FIG. 3.

Figure 1:
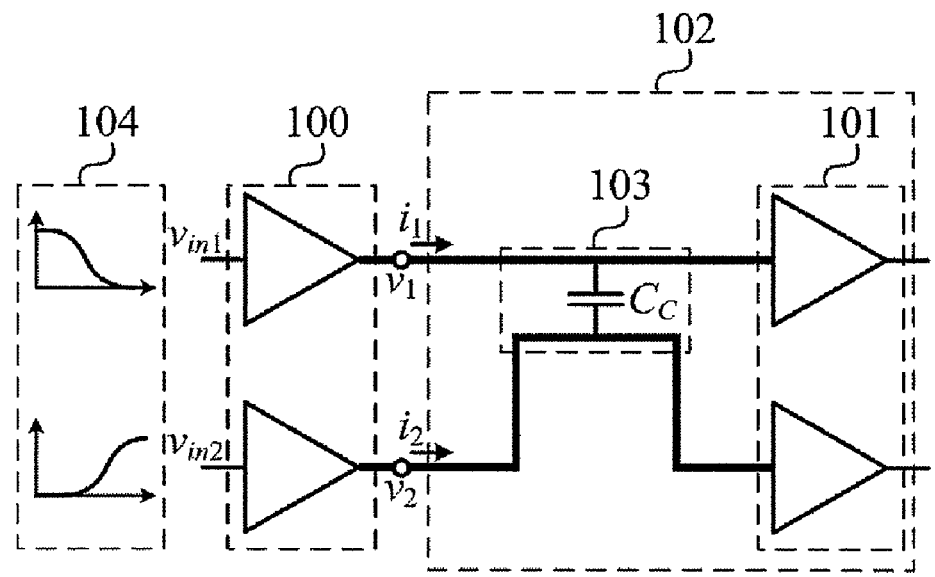
FIG. 1 is a circuit diagram of gates for driving an interconnect load coupled by a capacitor in a digital IC.
Figure 2:
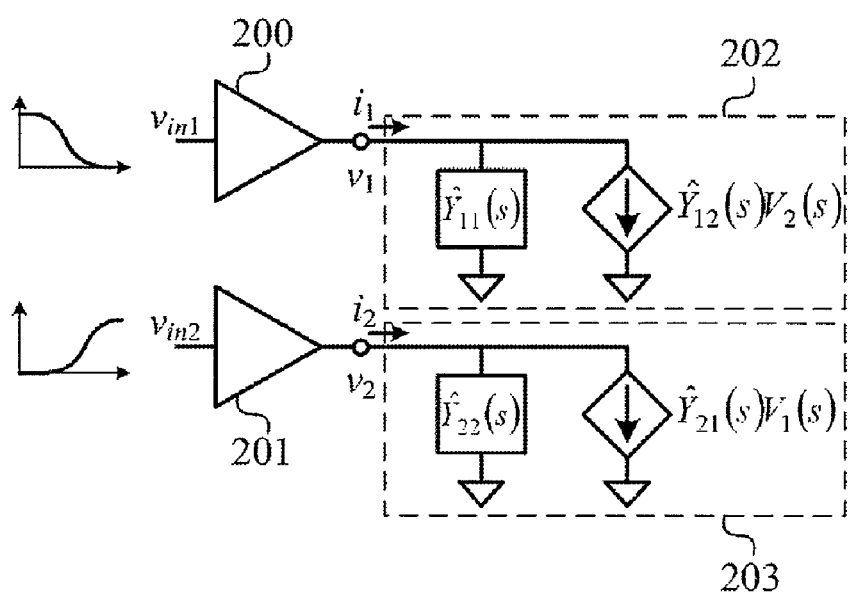
FIG. 2 is a circuit diagram of an equivalent reduced order model of the interconnect load of FIG. 1.
Figure 3:
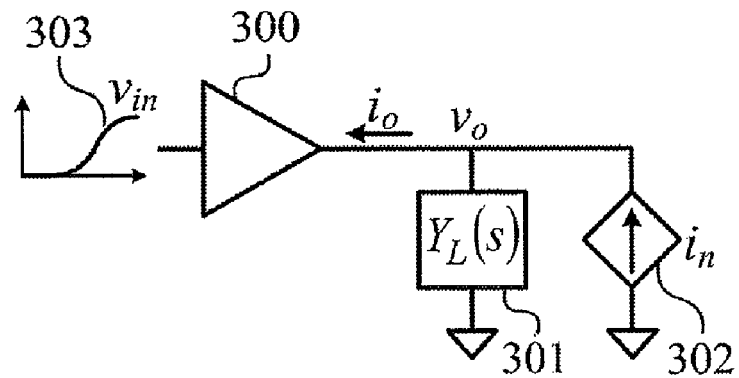
FIG. 3 is a circuit diagram for explaining calculation of an output waveform of one of two adjacent gates of FIG. 2.

Referring to FIG. 5, the output resistance values $R_o$ are measured based on the input voltage $v_{in}$ and the output voltage $v_o$ of the gate 300 shown in FIG. 3.

A power voltage is 1 V. When the gate 300 is in a stable state, the input voltage is $v_{in}$=0V and the output voltage is $v_0$=1V in a region 500, and the input voltage is $v_{in}$=1V and the output voltage is $v_0$=0V in a region 501. When input and output waveforms are switched, the gate 300 enters in the stable state having a small resistance value through a center region having a very large resistance value.

The output resistance values $R_o$ measured in the gate 300 can be divided on the basis of boundaries 502 and 503 having the same resistance value. The two boundaries 502 and 503 are necessary for generating a resistance model that exactly expresses a change in the output resistance $R_o$, however three or more boundaries may be necessary for generating a more exact resistance model.

A region of the output resistance values of the gate 300 is divided by the boundaries 502 and 503 on the basis of the smallest output resistance value on a boundary between a linear region and a saturation region in an operation region of a PMOS element and an NMOS element that are included in a CMOS element (not shown) that is generally an inverter. Information about the boundaries 502 and 503 is the relationship between an output voltage $v_{boundary}$ and the input voltage $v_{in}$ expressed according to equation 2 below, and may be cell library information.

$$(v_{boundary(i)}=f_i(v_{in}) \qquad (2)$$

A representative resistance value for each region is applied as shown in equation 2. The representative resistance value may be an average resistance value of a corresponding region or a resistance value that best forms an actual output waveform and an output waveform that use a model consistent to each other. A cell library stores a required number of resistance values for each gate expressed according to equation 3 below.

$$R_{lib}=\{R_{lib1}, R_{lib2}, R_{lib3}\} \qquad (3)$$

The above new output resistance library is generated before gate modeling is performed. Resistance values $R_{meas}$ measured with regard to the input voltage $v_{in}$ and the output voltage $v_o$ are stored in the output resistance library as expressed in equation 4. To calculate the output waveform of the gate 300, the representative resistance value for each region divided by the boundaries 502 and 503 may be used as the representative resistance value of equation 3.

$$R_{mean}=g(v_{in},v_o) \qquad (4)$$

Also, the boundaries 502 and 503 having the correlations between the output voltage $v_{boundary}$ and the input voltage $v_{in}$ expressed according to equation 2 may be converted into a function with regard to time. Time points where the output waveform of the gate 300 passes through the boundaries 502 and 503 may be found by using the function.

The output resistance library that includes the boundaries 502 and 503 that identify the characteristics of the output resistance of the gate 300 and the representative resistance value for each region divided by the boundaries 502 and 503 is used to generate the gate model.

Figure 6:
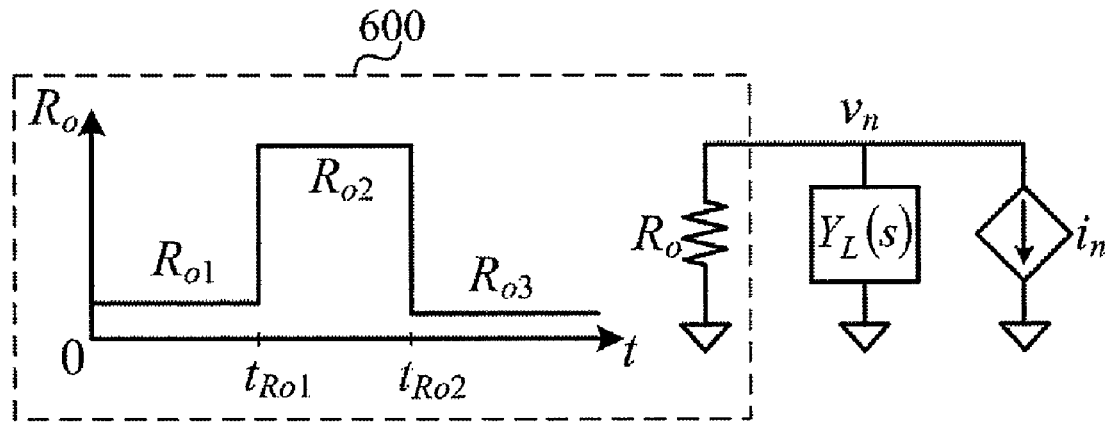
FIG. 6 shows a linear time-varying output resistance model and a circuit diagram of an equivalent circuit for obtaining a voltage response in an output of a gate with regard to a noise current source by using the linear time-varying output resistance model.

FIG. 6 shows a linear time-varying output resistance model 600 and a circuit diagram of an equivalent circuit for obtaining a voltage response in an output of a gate with regard to a noise current source by using the linear time-varying output resistance model 600.

Referring to FIG. 6, the linear time-varying output resistance model 600 may be generated on the basis of time points where a previously calculated or assumed output waveform of the gate 300 passes through, by using the average resistance value for each region divided by the boundaries 502 and 503. When the input voltage of the gate 300 is converted from 0V into 1V, and the output voltage of the gate 300 is converted from 1V into 0V, the output waveform of the gate 300 proceeds from the region 500 to the region 501 and crosses the boundaries 502 and 503. In this case, a time point tR01 is where the output waveform crosses the boundary 502, and a time point tRo2 is where the output waveform crosses the boundary 503. When the input voltage of the gate 300 is converted from 0V into 1V, and the output voltage of the gate 300 is converted from 1V into 0V, the output waveform of the gate 300 proceeds from the region 501 to the region 500 and crosses the boundaries 502 and 503. In this case, the time point tR01 is where the output waveform crosses the boundary 503, and the time point tRo2 is where the output waveform crosses the boundary 502. Representative resistance values R01, Ro2, and Ro3 for each region divided by the boundaries 502 and 503 are allocated to each time region divided by the time points tRo1 and tRo2 to generate the linear time-varying output resistance model 600. A voltage response vn of the output of the gate 300 with regard to the noise current source is calculated by using a gate circuit including the linear time-varying output resistance model 600.

Figure 7:
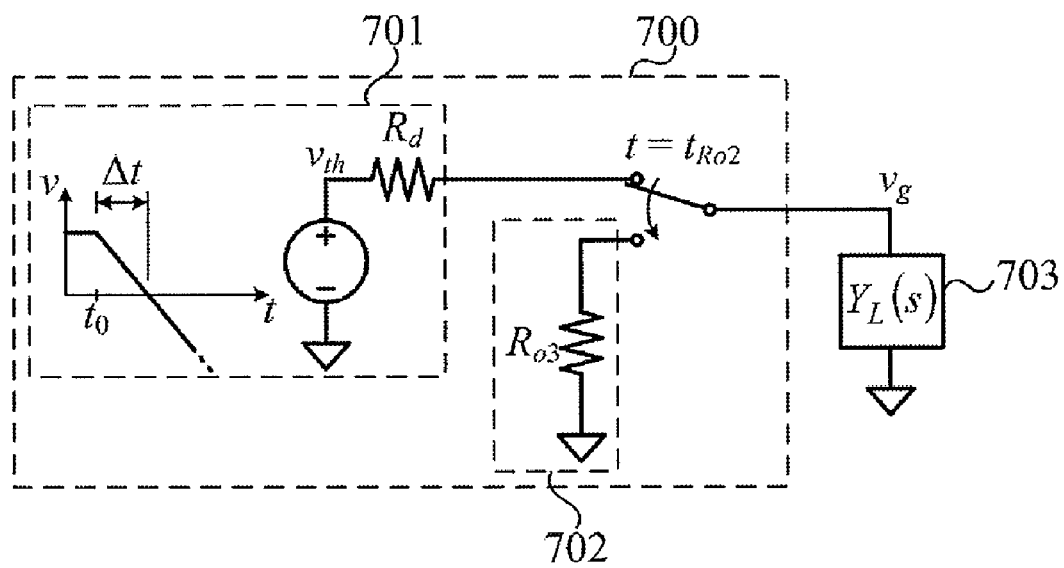
FIG. 7 is a circuit diagram of a modified Thevenin equivalent gate model for calculating a voltage response in an output of a gate driving current and a capacitive load, according to an embodiment of the present invention.

FIG. 7 is a circuit diagram of a modified Thevenin equivalent gate model 700 for calculating a voltage response in an output of a gate driving current and a capacitive load 703, according to an embodiment of the present invention. Referring to FIG. 7, the modified Thevenin equivalent gate model 700 is used to approximate the voltage response in the output of the gate 300 with regard to the driving current of the gate 300.

Figure 4:
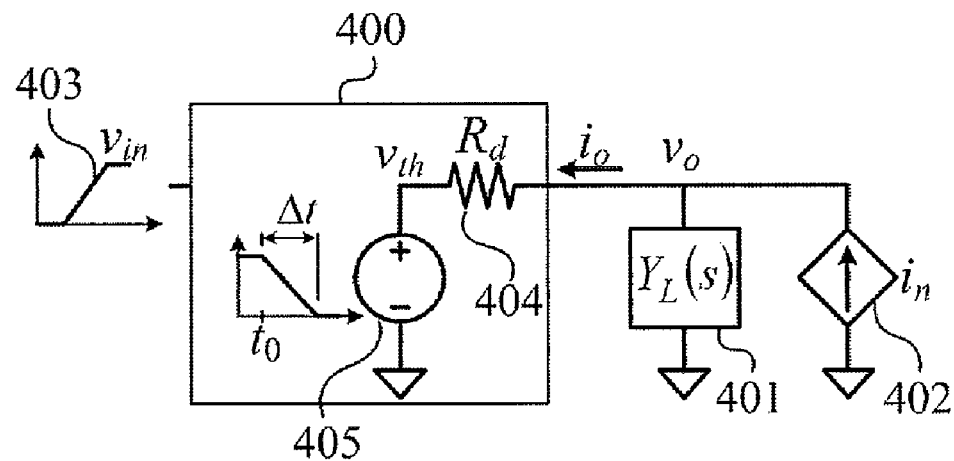
FIG. 4 is a circuit diagram of a gate model applied in a conventional method of calculating the delay of a gate.

A model 701 is similar to the conventional modified effective capacitance model or the Thevenin equivalent gate model 400 shown in FIG. 4 that uses the transient holding resistance calculation method, but uses a voltage source different to a voltage source of the Thevenin equivalent gate model 400. The voltage source of the model 701 uses a ramp waveform instead of a saturation ramp waveform that the voltage source 405 of the linear gate model 400 uses, and continuously decreases after delta t until a time point tRo2, even after the voltage source of the model 701 is 0 V.

A response model of the gate 300 uses the model 701 until a time point tRo2, and a linear resistance model 702 having the representative resistance value Ro3 after the time point tRo2.

Switching is performed on the basis of the time point tRo2 in that since an operation mode of the gate 300 is determined according to an input voltage and an output voltage, when the output voltage changes by noise, after the time point tRo2, the gate 300 operates as a linear resistor by a MOS transistor that enters into a linear mode, and before the time point tRo2, the gate 300 operates as a current source by the MOS transistor in a saturation mode. When the gate 300 operates as the current source, an output current of the gate 300 is rarely influenced by noise of a load according to a very large output resistance. Thus, a response when there is no noise current source is almost the same as a response when there is a noise current source.

If the gate 300 is driven in a saturation current state and then enters into a stable state, the gate 300 operates as a resistor. In the stable state, the gate 300 may use a value determined by the linear time-varying output resistance model 600.

When an output waveform of the gate 300 is given, the linear time-varying output resistance model 600 is generated, a response of a driving current of the gate 300 is obtained by transforming the modified Thevenin equivalent gate model 700 having no noise current source, the gate model 600 and the modified Thevenin equivalent gate model 700 are obtained from the initially assumed output waveform of the gate 300, and an output waveform of a new gate model is repeatedly calculated until the output waveform converges and the delay of the gate 300 is calculated by using the converged output waveform in the same manner as disclosed in cited reference 2.

Figure 8:
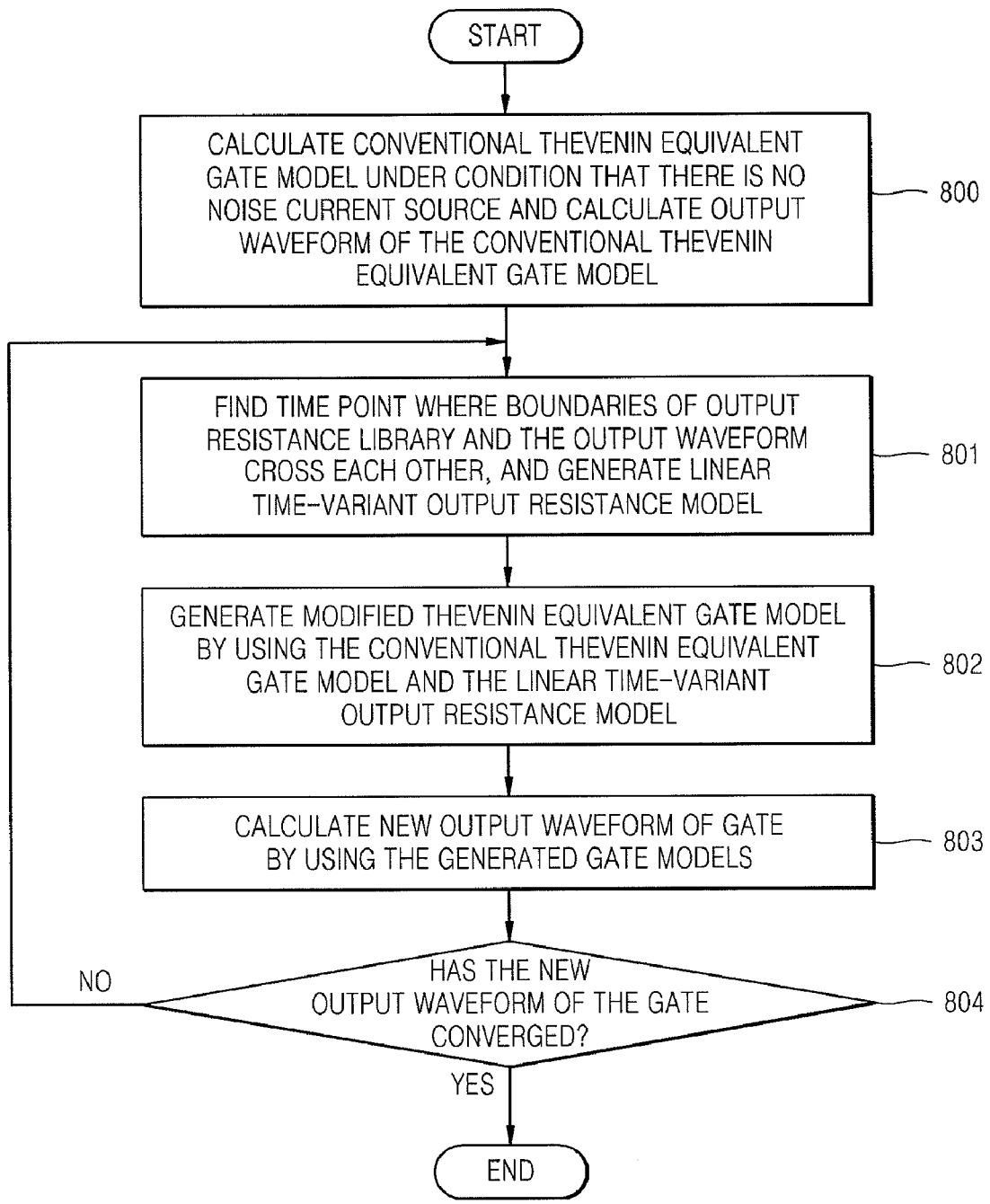
FIG. 8 is a flowchart illustrating a method of calculating an output waveform of a gate according to an embodiment of the present invention.

The above repetitive calculation process is summarized with reference to FIG. 8. FIG. 8 is a flowchart illustrating a method of calculating an output waveform of a gate according to an embodiment of the present invention.

Referring to FIG. 8, in operation 800, the linear gate model 400 is generated by applying the conventional gate modelling method in a state where there is no noise current source with regard to the gate 300 of a digital IC, and an output waveform calculated from the linear gate model 400 is assumed as an initial output waveform. In operation 801, the linear time-varying output resistance model 600 is obtained by finding a time point where the boundaries 502 and 503 and the output waveform of the gate 300 cross each other. In operation 802, the modified Thevenin equivalent gate model 700 is obtained by using the linear gate model 400 obtained in operation 800 and the linear time-varying output resistance model 600 obtained in operation 801. In operation 803, an output waveform to which voltages responses vg and vn are added is obtained by using the gate model 600 and the modified Thevenin equivalent gate model 700 obtained in operations 801 and 802. In operation 804, it is determined whether the output waveform obtained in operation 803 and the output waveform used to model the gate 300 are identical to each other. If it is determined that the output waveforms do not converge, operation 801 is performed. Otherwise, if it is determined that the output waveforms converge, the delay of the gate 300 is calculated by using the converged waveform.

In this regard, in operation 804, it is determined whether the output waveforms calculated in operation 800 are identical to each other. After operation 801 is performed again, it is determined whether the output waveforms calculated in operation 804 converge.

The gate model including a linear time-invariant output model and a linear time-varying output resistance model according to the present invention exactly reflects an actual output resistance of a gate, as compared to a conventional gate model including the linear time-invariant output model, thereby more exactly predicting an output waveform and the delay of a gate.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A computer-implemented method of calculating a delay of a gate based on a crosstalk effect due to capacitive coupling in a digital integrated circuit (IC), the method comprising:
   a generating using a computer a gate model of a Thevenin equivalent circuit with regard to a gate in the digital IC under a condition that there is no noise current source, and calculating an output waveform with regard to an input voltage;
   generating using the computer an output resistance library based on the input voltage and an output voltage of the gate wherein an output resistance of the gate is measured by using a function of the input voltage and the output voltage of the gate and is divided into a plurality of regions by boundaries identifying characteristics of the output resistance,
   wherein the output resistance library of the gate includes a representative resistance value for each of the plurality of the regions and the boundaries for dividing the plurality of the regions;
   c generating using the computer a linear time-varying output resistance model with regard to the gate by using the output waveform and the output resistance library;
   d generating using the computer a modified Thevenin equivalent gate model of the gate under the condition that there is no noise current source by using the linear time-varying output resistance model, and calculating an output waveform that sums a waveform output by using the modified Thevenin equivalent gate model and an output waveform calculated in response to the noise current source with regard to the linear time-varying output resistance model; and
   e repeatedly applying the output waveform calculated using the computer in operation d to operation c, if the output waveform calculated in operation d does not converge; and, if the output waveform calculated in operation d converges, calculating the delay of the gate by using the converged output waveform.

2. The computer-implemented method of claim 1, wherein operation c comprises: generating using the computer the linear time-varying output resistance model by using the output waveform calculated in operation a and repeatedly generating the linear time-varying output resistance model by using the output waveform calculated in operation d.

3. The computer-implemented method of claim 1, wherein the output resistance library divides the plurality of regions by using the boundaries of the output resistance values of the gate that rapidly change according to the input voltage and the output voltage of the gate, and each region stores an average output resistance value of the gate.

4. The computer-implemented method of claim 1, wherein the output resistance region of the gate of the linear time-varying output resistance model is divided into more than three regions.

* * * * *